United States Patent
Forey et al.

(10) Patent No.: US 9,705,666 B2
(45) Date of Patent: *Jul. 11, 2017

(54) FREQUENCY ACQUISITION FOR SERDES RECEIVERS

(71) Applicant: INPHI CORPORATION, Santa Clara, CA (US)

(72) Inventors: Simon Forey, Northamptonshire (GB); Parmanand Mishra, Thousand Oaks, CA (US); Sean Batty, Machynlleth (GB)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/433,601

(22) Filed: Feb. 15, 2017

(65) Prior Publication Data

US 2017/0163408 A1    Jun. 8, 2017

Related U.S. Application Data

(63) Continuation of application No. 15/214,212, filed on Jul. 19, 2016, now Pat. No. 9,608,799, which is a continuation of application No. 14/696,326, filed on Apr. 24, 2015, now Pat. No. 9,413,523.

(51) Int. Cl.
| | |
|---|---|
| *H04L 7/00* | (2006.01) |
| *H04L 7/033* | (2006.01) |
| *H04L 7/06* | (2006.01) |
| *H04L 27/152* | (2006.01) |
| *H04B 10/61* | (2013.01) |

(52) U.S. Cl.
CPC ....... *H04L 7/0087* (2013.01); *H04B 10/6164* (2013.01); *H04L 7/0004* (2013.01); *H04L 7/0331* (2013.01); *H04L 7/06* (2013.01); *H04L 27/152* (2013.01)

(58) Field of Classification Search
CPC ... H03L 7/00; H03L 7/06; H03L 7/091; H04L 7/00; H04L 7/0004; H04L 7/0087; H04L 7/033; H04L 7/0331; H04L 7/061; H04L 27/152; H04L 7/06; H04L 27/152; H04B 10/6164; H04B 10/67
USPC ....... 375/326, 327, 355, 362, 371, 373, 376; 327/105, 113, 141; 713/400, 500, 501, 713/503, 600
See application file for complete search history.

(56) References Cited

U.S. PATENT DOCUMENTS

| | | | | |
|---|---|---|---|---|
| 4,805,191 | A * | 2/1989 | Burch | H04L 7/0054 375/229 |
| 4,896,337 | A * | 1/1990 | Bushy, Jr. | H03L 7/0992 327/261 |
| 2005/0180536 | A1 * | 8/2005 | Payne | H03L 7/0814 375/354 |

* cited by examiner

*Primary Examiner* — Young T Tse
(74) *Attorney, Agent, or Firm* — Richard T. Ogawa; Ogawa P.C.

(57) ABSTRACT

The present invention is directed to data communication. More specifically, embodiments of the present invention provide a method for acquiring sampling frequency by sweeping through a predetermined frequency range, performing data sampling at different frequencies within the predetermined frequency range, and determining a target frequency for sampling data based on a maximum early peak frequency and a maximum late peak frequency. There are other embodiments as well.

20 Claims, 4 Drawing Sheets

FREQUENCY ACQUISITION FOR SERDES RECEIVERS

CROSS-REFERENCES TO RELATED APPLICATIONS

This application claims priority to and is a continuation of U.S. patent application Ser. No. 15/214,212 filed Jul. 19, 2016, now U.S. Pat. No. 9,608,799, which is a continuation of and claims priority to U.S. application Ser. No. 14/696, 326 filed Apr. 24, 2015, now U.S. Pat. No. 9,413,523, issued Aug. 9, 2016, commonly assigned and incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to data communication.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, serializer/deserializer (SERDES) is commonly used.

Over the past, there have been many types of communication systems and methods. Unfortunately, they have been inadequate for various applications. More specifically, the SERDES receivers are often inadequate. Therefore, improved systems and methods are desired.

BRIEF SUMMARY OF THE INVENTION

The present invention is directed to data communication. More specifically, embodiments of the present invention provide a method for acquiring sampling frequency by sweeping through a predetermined frequency range, performing data sampling at different frequencies within the predetermined frequency range, and determining a target frequency for sampling data based on a maximum early peak frequency and a maximum late peak frequency. There are other embodiments as well.

DETAILED DESCRIPTION OF THE INVENTION

The present invention is directed to data communication. More specifically, embodiments of the present invention provide a method for acquiring sampling frequency by sweeping through a predetermined frequency range, performing data sampling at different frequencies within the predetermined frequency range, and determining a target frequency for sampling data based on a maximum early peak frequency and a maximum late peak frequency. There are other embodiments as well.

Providing clock signals is a vital aspect in design and implementation of data communication systems. For example, a typical serializer/deserializer (SERDES) receiver uses an external clock as a reference to generate the recovered clock signal that is used to sample data. The external clock needs to be of high quality, and frequency is matched to within a few hundred parts per million of a known sub-multiple of the data rate. For example, it is common for 28 Gb/s SERDES to require a reference clock of 350 Mhz±0.02%, which is associated with an ⅟₈₀ of the data rate. Such implementation requires a crystal oscillator in the system and associated distribution circuits.

Figure 1:
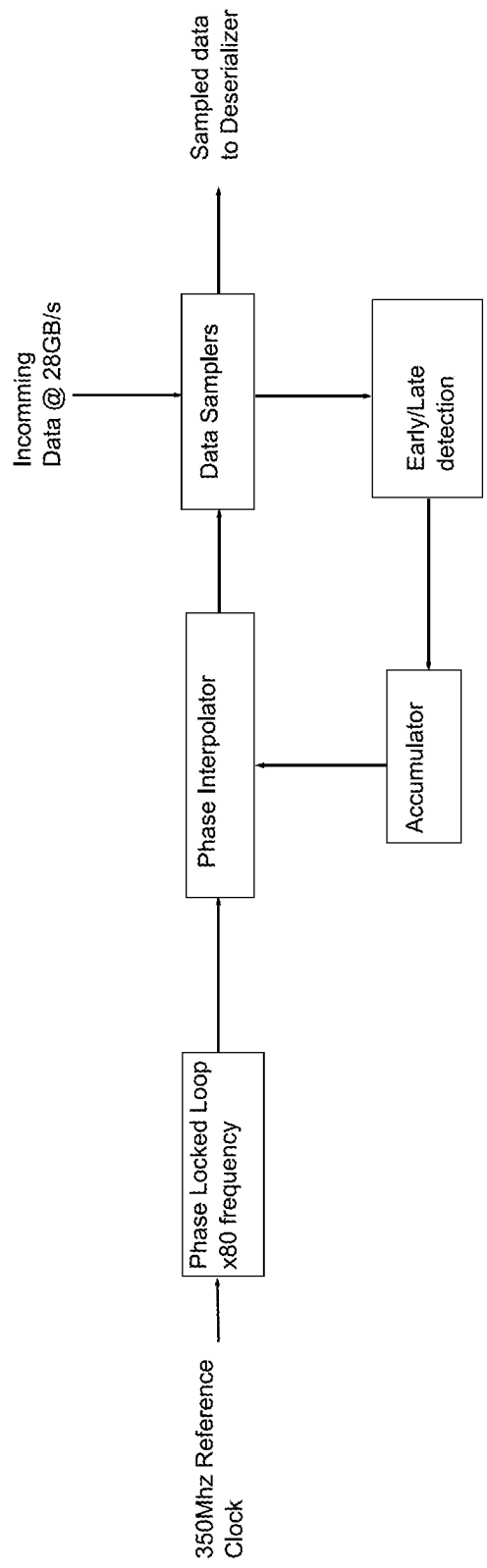
FIG. 1 is a simplified diagram illustrating a conventional SERDES receiver.

FIG. 1 is a simplified diagram illustrating a conventional SERDES receiver. As shown in FIG. 1, a reference clock provides a 350 Mhz reference frequency, which is multiplied by a phase-lock loop (PLL) to produce a clock at the required data rate (or a sub-multiple thereof for a time interleaved system). The clock signal is adjusted, in phase and frequency, by a phase interpolator to produce clock signals aligned to the center and edges of the incoming data. An early/late detection logic determines whether the clocks are sampling in the center of the eye, and adjusts the controls of the phase interpolator to get the required alignment. The external reference clock and the PLL can consume a relatively large amount of power for the SERDES receiver.

SERDES implementations with external clock signals (e.g., SERDES receiver shown in FIG. 1) can be expensive, both in power and circuit area. For example, if a SERDES could be implemented without a reference clock, it could save power in creating and distributing this reference. While it is possible and convenient to generate reference clock signals using an on-chip oscillator, it is hard to get the required accuracy in the face of process, voltage, and/or temperature variations. It is to be appreciated that according to various embodiments of the present invention, an on-chip oscillator is configured to provide reference clock signals, and it is tuned at chip start-up.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

According to various embodiments, the present invention provides a SERDES receiver that does not rely on external reference clock, PLL, and phase interpolator to process data at correct data rate. By eliminating these components from SERDES receivers, large device area and a great amount of power consumption are saved. An on-chip oscillator has a (digital) input that controls the frequency and an analog input that adjusts (e.g., advances or retards) the phase of the clocks. The SERDES receiver additionally includes data samplers, early/late detection logic, and accumulator. For example, the data samplers typically include both edge clock sampler and data sampler. It is to be appreciated that SERDES receivers according to embodiments of the present invention can provide same or greater level of performance as conventional devices, but with lower power consumption and smaller device area.

As explain above, an important aspect of data sampling is to determine the correct sampling frequencies. In various embodiments, a SERDES receiver according to embodiments of the present invention sweeps through a range of frequencies to determine the digital code to set the sampling frequency. During the frequency sweep process, early/late detection logic is used to determine the correct frequency. Depending on the implementation, existing early/late detection logic may be incorporated into the embodiments of the present invention. For example, early/late detection logic may be implemented using phase comparators similar to those used in CDR devices. Using early/late detection logic, the need for high-speed circuitry can be avoided.

As the SERDES receiver sweeps through a range of frequencies, the oscillator generates different frequencies (e.g., from low to high, or high to low). The data samplers sample data at these different frequencies. If the oscillator is operating at the correct frequency range, then the early/late logic will produce approximately equal numbers of early and late votes, which is counted by the accumulator. More specifically, if the frequency sweeps from low to high, the accumulator will count a high number of "early" due to frequency being slightly low, and then as frequency increases (as a part of the sweep) and moves past the correct sampling frequency, the accumulator will count a high number of "late" due to frequency being slight high. On the other hand, if the oscillator frequency is off by more than the tracking range of the clock data recover (CDR) loop, which is typically only a fraction of a percent, the CDR loop loses lock and the early/late determinations are essentially random.

When the sample frequency is far off (i.e., far enough from the actual sampling frequency range), the system is unable to actually acquire actual data at "wrong" frequencies, and wrongly sampled data are mostly noise. When early/late detection module processes a large number of wrongly sample data that are mostly noise, the number of "early" determinations is likely to be statically equal to the number of "late" determinations. The accumulator that aggregates the result of the early/late detection (e.g., each early detection is a "+1" and each late detection is a "−1"), the sum of early and late over a large sample size stays at approximately "0" since the number of early detections essentially cancel out the number of late detections. On the other hand, if the sample frequency is not too far off, the system is able to both sample and have meaningful detection as whether the sampling process is "early" or "late". More specifically, if the sampling frequency is close enough for the system to sample data but is slightly lower than actual data rate frequency, the early/late detection module would generate a large number of "early" detections, and the sum aggregated by the accumulator will be a positive number that is statistically larger than the number of early detections when the sampling frequency is far off. On the other hand, if the sampling frequency is close enough for the system to sample data but is slightly higher than actual data rate frequency, the early/late detection module generates a large number of "late" detections, and the sum aggregated by the accumulator will be a negative number that is statistically much lower than the number of early detections when the sampling frequency is far off. By sweeping the frequency in small steps across a wide range and at each point counting the early and late votes in a large enough window to have a statistically significant number of samples, a system according to embodiments of the present invention can find the point at the upper and lower ends of the CDR's tracking range. By assuming symmetry, the correct point is approximately at the mid-way between these upper and lower frequencies.

Figure 2:
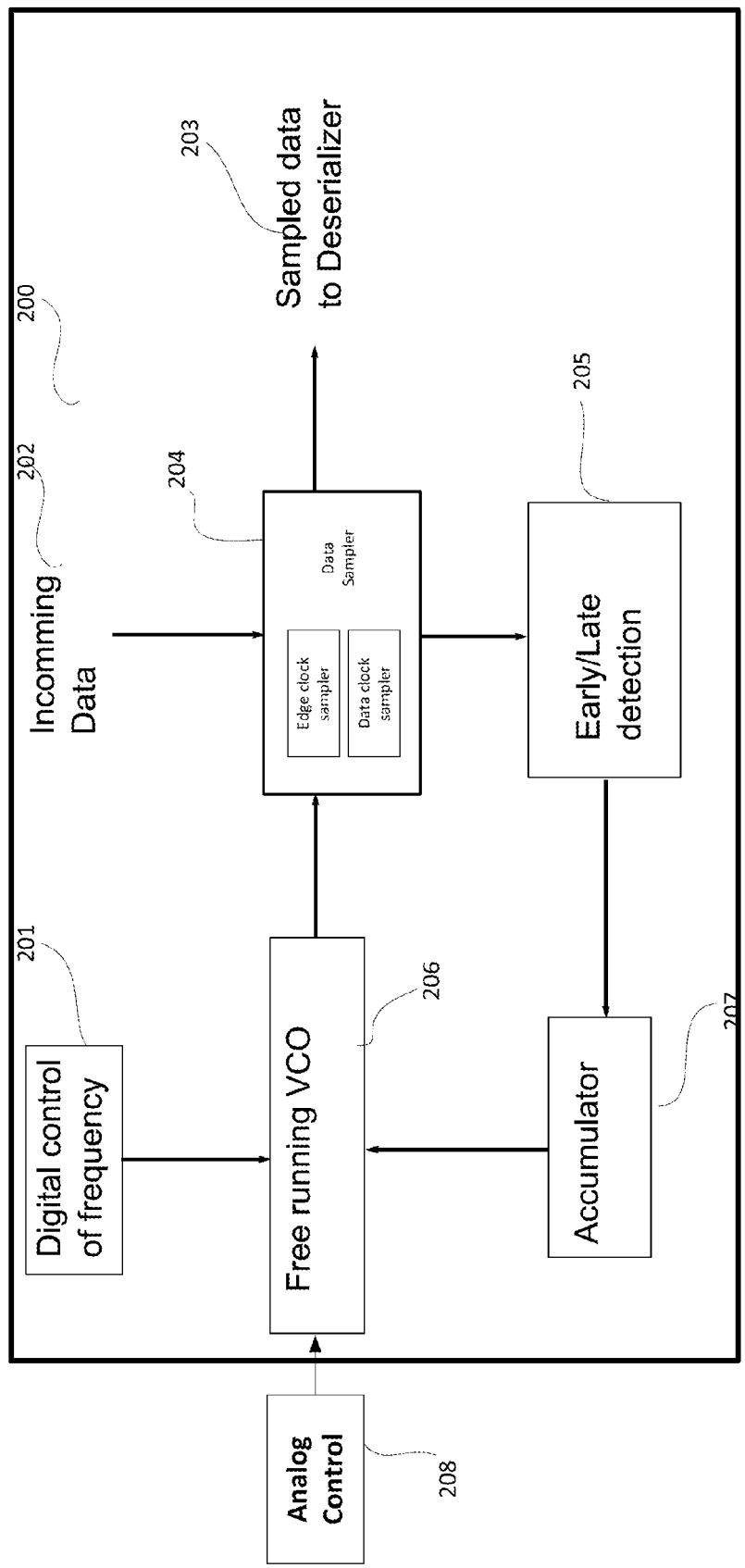
FIG. 2 is a simplified diagram illustrating a SERDES receiver 200 according to an embodiment of the present invention.

FIG. 2 is a simplified diagram illustrating a SERDES receiver 200 according to an embodiment of the present invention. This diagram is merely an example, which should not unduly limit the scope of the claims. One of ordinary skill in the art would recognize many variations, alternatives, and modifications. The SERDES receiver 200 includes data sampler 204, which is configured to sample the incoming data 202 at a sample rate that is based on the clock frequency of the voltage controlled oscillator (VCO) 206. The data sampler 204 outputs sampled data to a deserializer 203. In various embodiments, incoming data is received through a data communication interface. For example, the data communication interface may be implemented to receive data received from one or more optical communication links. The incoming data is characterized by a data rate that is typically unchanged once the receiver 200 starts operating. The receiver 200 thus needs to determine the data rate to be used by the data sampler 204 to sample the incoming data. It is to be understood that the data sampler 204 often use more than one clocks to perform data sampling. In various embodiments, the data sampler 204 includes an edge clock sampler and a data clock sampler. The data sampler 204 may include additional samplers as needed.

The data sampler 204 is connected to the detection module 205. The detection module 205 determines whether the sample data are early or late. For example, the detection module 205 can be implemented in various ways. For example, the detection module 205 may be implemented using a CDR phase comparator. The detection module 205 may be implemented in other ways as well. In certain embodiments, the detection module 205 output a number for each of the early/late determination made. For example, for each data sample that is determined to be early, the detection module 205 outputs a "+1", and for each data sample that is determined to be late, the detection module 205 outputs a "−1". The output of the detection module 205 is processed by the accumulator 207. For example, the accumulator 207 stores a sum value based on the output provided by the detection module 205. For example, if the sum stored and updated by the accumulator 207 is a large positive number, it means that there are many "early" samples determined by the detection module 205, and it is likely that the sampler 204 is sampling and operating at a frequency lower than the data rate of the incoming data. On the other hand, if the sum stored and updated by the accumulator 207 is a large negative number, it means that there are many "late" samples determined by the detection module 205, and it is likely that the sampler 204 is operating at a frequency higher than the data rate of the incoming data. Among other things, the receiver 200 can use the information stored by the accumulator 207 to check whether the sampling frequency is correct and to make corrections as needed.

The sampling rate of the data sampler 204, as explained above, is regulated by the clock signal provided the VCO 206. In various embodiments, the VCO 206 is implemented on the same chip as other components of the receiver 200. For example, the receiver 200 integrates components such as communication interface, sampler, detection module, accumulator, VCO, and/or other components on a single chip, which translates to reduced power consumption and chip size when compared to conventional devices. By eliminating the need for external reference clock module and PLL used in convention SERDES receivers (e.g., receiver illustrated in FIG. 1), system power consumption is greatly reduced.

The VCO 206 is connected to the digital control module 201 and the analog control module 208. The digital control module 201 provides digital control for adjusting the frequency of the VCO 206. The analog control module 208 is configured to provide an input that advances or retards the phase of clock signals generated by the VCO 206. For example, the digital control module 201 and analog control module 208 are implemented as a part of a feedback control loop that adjusts the outputs of the VCO 206 based on the output of the accumulator 207. As described above, in a scheme where the accumulator 207 maintains a sum that is increases by "early" determinations and decreased by "late" determinations, the VCO 206 is configured to increase its output frequency when the sum is positive and decrease its output frequency when the sum is negative. In various embodiments, the digital control module 201 receives the output of the accumulator and generates control signals that changes the frequency output of the VCO 206. The control signals from the digital control module 201 may indicate both the direction and amount of frequency change. For example, a large positive sum from the accumulator 207 means that the digital control module 201 causes the VCO 206 to increase the output frequency by a large amount, and a large negative sum from the accumulator 207 means that the digital control module causes the VCO 206 to decrease the output frequency by a large amount.

In various implementations, adjustment of clock signal frequency generated by the VCO 206 is an on-going process, where the receiver 200 monitors the frequency changes using the detection module 205 and the accumulator 207, and uses digital control module 201 and analog control module 208 to cause VCO 206 to change its output accordingly. It is to be appreciated that in addition to adjusting sampling frequency when operating, the receiver 200 is also configured to determine the sampling frequency during an initialization process.

Figure 3:
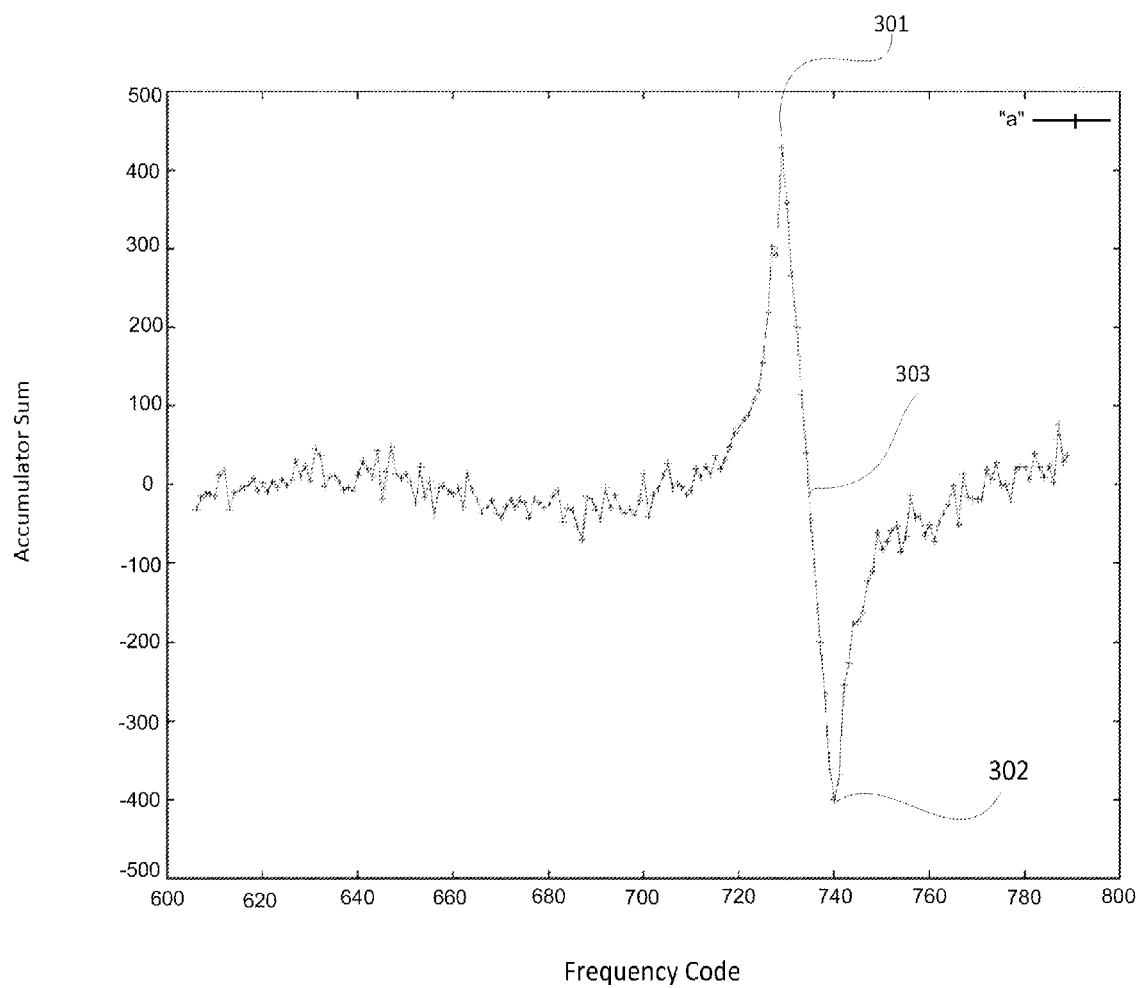
FIG. 3 is a graph illustrating a process for determining a sampling frequency according to an embodiment of the present invention.

FIG. 3 is a graph illustrating a process for determining a sampling frequency according to an embodiment of the present invention. This diagram is merely an example, which should not unduly limit the scope of the claims. One of ordinary skill in the art would recognize many variations, alternatives, and modifications. For example, determination process is performed by the receiver 200 illustrated in FIG. 2. In FIG. 3, the horizontal axis is for the sampling frequency code, and the vertical axis is for the accumulator output. For example, frequency code refers to digital code used by the digital control module to control the VCO 206. For example, a "1" in frequency code corresponds to 50 MHz (e.g., a frequency code of 600 represent a frequency of 3 GHz).

To provide an example, the correct sampling frequency code is 730, which the receiver does not initially know. So the receivers sweep through a frequency code range from 600 to 800, as shown in FIG. 3. It is to be appreciated that depending on specific application and the operating condition thereof, the sweep frequency range may vary, and the frequency range is specifically selected to cover the target frequency. For example, through the digital control module, the receiver causes the VCO to generate clock signals based control signals from the control module corresponding to a frequency code of 600 for a predetermined interval, then a higher frequency (e.g., frequency code 601) for another predetermined interval, and then another, until the frequency code is at 800. During each of these intervals, a set number (e.g., 500 samples) of data samples are processed by detection module to determine whether each sample is early or late, and the accumulator module updates a sum value according. The number of samples at each of these intervals is typically greater than 500 to ensure that the sample size is statistically large enough for the frequency acquisition process. It is to be appreciated that sweep frequency range, increment step size (e.g., increasing frequency code by "1" for each step, which may correspond to a 50 MHz change in frequency) of the frequency sweep, the predetermined interval for each of the frequency increment, the number of samples per each predetermine interval, and/or other parameters of frequency sweep process may be adjusted for the specific implementations.

As the receiver performs frequency sweep, the accumulator module provides an output value (or sum value) during each of the interval, as shown in FIG. 3. For example, the output value is based on the sum of early/late detections during a predetermined interval. For example, an "early" detection increases the sum by "1" and a "late" detection decreases the sum by "1". When the frequency is far off from the target frequency (e.g., a few percent off), the output value of the accumulator is mostly noise. For example, as shown in FIG. 3, when the frequency is between 600 and 700 in frequency code, the accumulator output oscillates between "+100" and "−100" and mostly stays around "0". Similarly, when the frequency is between 760 and 800 in frequency code, the accumulator output also oscillates between "+100" and "−100". This is because when the sampling frequency is far off, the early and late determinations are mostly randomly noise, and the sums stored by the accumulator oscillates and centers on zero. For example, if early/late detection is performed on a statistically much larger number (e.g., over 10,000 samples) of samples, the sum stored by the accumulator should be very close to zero, as the number of early detections and the number of late detections are likely to be very close.

On the other hand, once the sweeping frequency is close to the target frequency, the sum stored at the accumulator becomes large, and reaches a positive peak at point 301, where there is a maximum number of early detections. As the sweeping frequency increases to a lower bond frequency that is close enough for the sampler to obtain actual data samples that are mostly "early", there are many more "early" detections than "late" detections (e.g., late detections most likely come from bad data samples). As sweeping frequency further increases, the sampling frequency eventually reaches the target frequency code of 730, at point 303. At point 303, the accumulator has a sum of about "0", the sampling frequency is now correct and there is essentially no early or late detections. As the sweeping frequency increases further, the number of "late" detection increases, since the frequency is now higher than the target frequency. A negative peak is reached at point 302, where there are a maximum number of late detections. That is, at point 302, the sampling frequency is still capable of sampling data that are "late", and there are many more "late" detections than early detections that are attributed to bad data samples. As the sweeping frequency increases past the frequency at point 302, the number of "late" detection decreases, as the number of bad data samples increases when the frequency moves further away from the target frequency. When the sweep frequency code is at 790, the accumulator sum is again oscillating between "+100" and "−100" and centered around "0".

To determine the target frequency, the receiver determines a midpoint between the positive peak 301 (i.e., maximum number of "early" detections) and the negative peak 302 (i.e., maximum number of "late" detections). For example, in FIG. 3 the positive peak 301 is at frequency code 720, and the negative peak 302 is at frequency code 740, and the midpoint is at the frequency code of 730, which is the target frequency stated earlier. In various embodiments, the target frequency is calculated by a digital control module. For example, the digital control module stores frequencies associated with the maximum positive peak and the maximum negative peak, and the digital control module calculates the target frequency by averaging these two frequencies. For example, average of frequency code 730 is calculated from the maximum positive peak frequency code 720 and the maximum negative peak frequency code 730.

In various embodiments, the frequency acquisition process described above is performed at the start of receiver operation on each link when the receiver starts receiving data at a specific data rate frequency. Once the target frequency is acquired, the frequency acquisition process is stopped and it does not need to be performed again unless the data rate or frequency changes.

Figure 4:
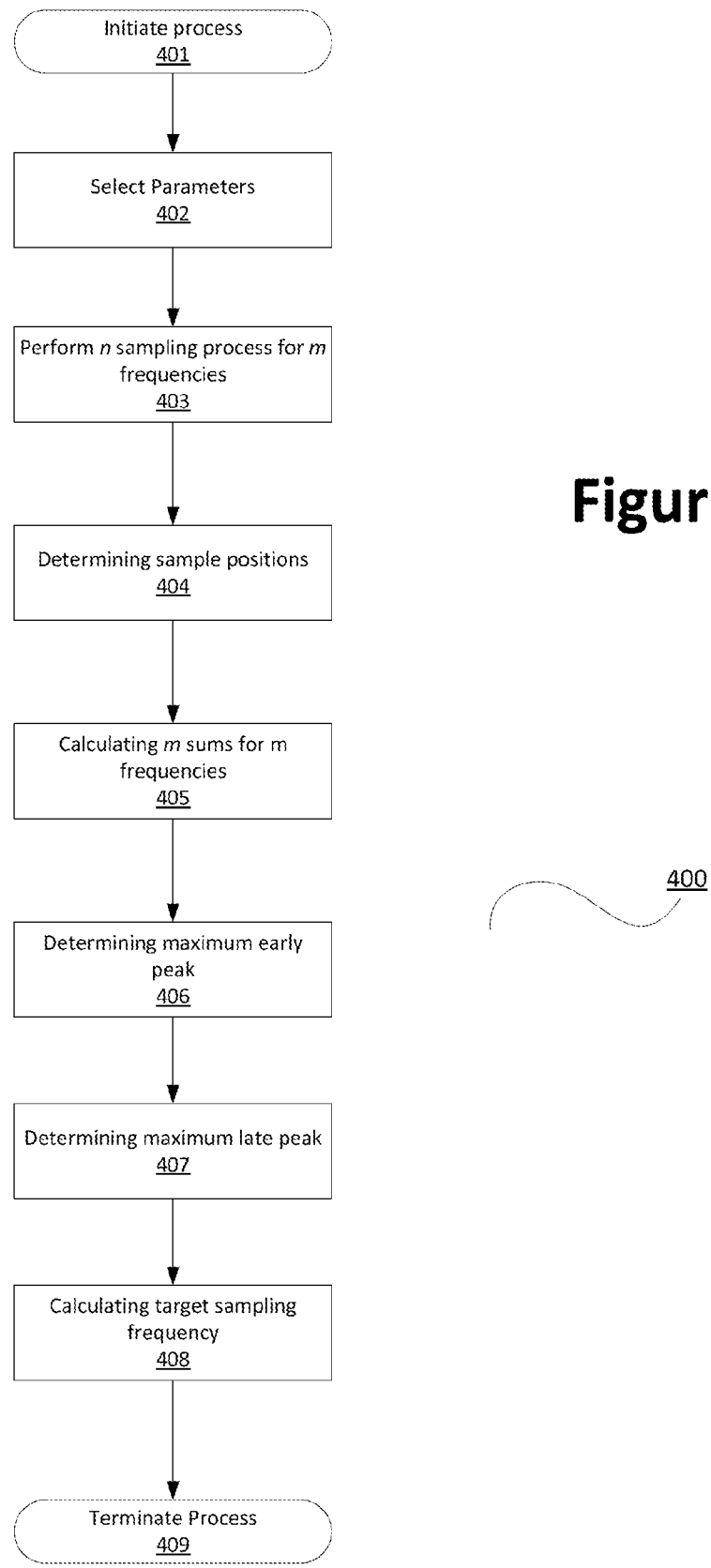
FIG. 4 is simplified flow diagram illustrating a process for acquiring sampling frequency according to an embodiment of the present invention.

FIG. 4 is simplified flow diagram illustrating a process for acquiring sampling frequency according to an embodiment of the present invention. This diagram is merely an example, which should not unduly limit the scope of the claims. One of ordinary skill in the art would recognize many variations, alternatives, and modifications. For example, one or more steps may be added, removed, repeated, rearranged, modified, replaced, and/or overlapped, which should not unduly limit the scope of the claims.

At step 401, a frequency acquisition process is initiated. According to various implementations, frequency acquisition process is performed when the receiver system starts, or when data rate changes, which necessitates a change in sampling rate.

At step 402, various frequency acquisition parameters are selected. For example, frequency acquisition parameters includes sweeping frequency range, step size, number of data samples to be collected at each frequency, and/or other parameters. Using these parameters, n sampling processes are performed for each of the m frequencies, at step 403. Typically, n is greater than or equal to 500, which represents a statistically significant number of samples with small less likelihood of statistical anomaly. On the other hand, if n is too large (e.g., over 10,000 samples), the sampling time and consequently the startup time might be too long. Within the sweeping frequency range, m number of frequencies is scanned. For example, for frequency code between 600 and 800, a step size of "1" frequency code means m=200. For the frequency acquisition process, a total of at least m*n samples are processed.

For each of the m*n samples, the detection logic (e.g., early/late detection logic) determines its sampling position, which could be in position, early, or late, at step 404. For example, detection logic uses phase calculation to determine the position of the sampled data.

The results of the detection logic are then used by an accumulator to calculate a sum for each of the frequencies, at step 405. For example, the accumulator adds a "1" to the sum when a sample is determined to be early, and it adds a "−1" when a sample is determined to be late. In various embodiments, the accumulator stores at least m sums, each of the sums corresponding to a sample frequency. As explained above, when the sampling frequency is far off, the results from the detection logic are substantially random, and the sum for that frequency is typically small and hovers around "0". However, as sample frequency is close enough, a large number of sampled data are likely to be early or late. The early and late peaks are used to determine the target sampling frequency.

At step 406, the maximum early peak frequency is determined. For example, the maximum early peak frequency can be determined by comparing all the sums calculated and stored by the accumulator and selecting the greatest sum. Each of the sums corresponding to the detection result sum of n samples at one of the m frequencies. Since each early detection increases the sum by "1", the maximum early peak frequency can be determined by finding frequency corresponding to the largest sum.

At step 407, the maximum late peak frequency is determined. For example, the maximum late peak frequency can be determined by comparing all the sums calculated and stored by the accumulator and selecting the greatest negative sum. Each of the sums corresponding to the detection result sum of n samples at one of the m frequencies. Since each early detection changes the sum by "−1", the maximum late peak frequency can be determined by finding frequency corresponding to the lowest sum.

At step 408, the target frequency is calculated by using the two peak frequencies determined at steps 406 and 407. As explained above, the target frequency is typically at midpoint between the maximum early peak frequency and the maximum late peak frequency. In a specific embodiment, the target frequency is calculated by averaging the maximum early peak frequency and the maximum late peak frequency. Depending on the implementation, the target frequency can be interpolated using the two peak frequencies in various ways.

The frequency acquisition process does not need to be performed many times. Typically, frequency sweep and determination is performed only at system start, reset, or data rate change events. At step 409, the frequency acquisition process terminates. Upon termination of the frequency acquisition process, the system uses the target frequency for data sampling. Depending on the implementation, additional frequency adjustment may be performed as a part of the system operation. There can be other steps to be performed as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A serializer/deserializer (SERDES) device comprising:
a data communication interface for receiving incoming data;
a data sampler configured to process the incoming data using an adjustable rate of a clock signal to generate sampled data;
a detection logic circuit configured to determine sampling positions for the sampled data, the sampling positions including early and late determinations;
a digital control circuit configured to generate frequency control signals based on an output value; and
an oscillator configured to generate the clock signal, the adjustable rate being associated with the frequency control signals; and
a deserializer configured to perform deserialization on data processed by the data sampler;
wherein the SERDES device is configured to:
initiate a frequency acquisition process;
perform n sampling processes on the incoming data at m frequencies to generate n data samples at each of the m frequencies, a total of n*m sampling processes being performed, the m frequencies being within a predetermined frequency range, n being associated with a number of sampling processes, m being associated with a number of frequencies;
determine sampling positions for each of the n data samples at each of the m frequencies by the detection logic circuit;
calculate m sums for the m frequencies, each of the m sums being calculated using the sampling positions of the n data samples; and
determine a frequency range based on a maximum early detection sum and a maximum late detection sum.

2. The device of claim 1 further comprising an analog control circuit coupled to the oscillator.

3. The device of claim 1 further comprising an accumulator for storing the m sums.

4. The device of claim 1 wherein the oscillator comprises a voltage controlled oscillator.

5. The device of claim 1 wherein the SERDES device is configured to perform at least m*n sampling processes during the frequency acquisition process.

6. The device of claim 1 wherein the digital control circuit is configured to select a sampling frequency, the sampling frequency being within the frequency range.

7. The device of claim 1 further comprising an analog control circuit configured to adjust phases of the clock signal.

8. The device of claim 1 wherein each of the m frequencies corresponds to a frequency code.

9. The device of claim 1 wherein the data sampler comprises an edge clock sampler and a data clock sampler.

10. A communication apparatus comprising:
a data communication interface for receiving incoming data;
a data sampler configured to process the incoming data using an adjustable rate of a clock signal to generate sampled data;
a detection logic circuit configured to determine sampling positions for the sampled data, the sampling positions including early and late determinations;
a digital control circuit configured to generate frequency control signals based on an output value;
an oscillator configured to generate the clock signal, the adjustable rate being associated with the frequency control signals; and
a deserializer configured to process the sampled data at a target frequency;
wherein the apparatus is configured to:
initiate a frequency acquisition process;
perform n sampling processes on the incoming data at m frequencies to generate n data samples at each of the m frequencies, a total of n*m sampling processes being performed, the m frequencies being within a predetermined frequency range, n being associated with a number of sampling processes, m being associated with a number of frequencies;
determine sampling positions for each of the n data samples at each of the m frequencies by the detection logic circuit, early sampling positions being assigned positive values, late sampling positions being assigned negative value;
calculate m sums for the m frequencies by an accumulator, each of the m sums being calculated using the sampling positions of the n data samples; and
determine a frequency range defined between a lowest sum and a greatest sum stored by the accumulator.

11. The apparatus of claim 10 wherein the detection logic circuit comprises a clock data recovery (CDR) phase comparator.

12. The apparatus of claim 10 wherein the target frequency is approximately a middle value of the frequency range.

13. A method for providing frequency acquisition, the method comprising:
initiating a frequency acquisition process;
selecting a frequency range;
performing n sampling processes on incoming data at m frequencies to generate n data samples at each of the m frequencies, the m frequencies being within the frequency range, n being associated with a number of sampling processes, m being associated with a number of frequencies, a total of n*m sampling processes being performed;
determining sampling positions for each of the n data samples at each of the m frequencies by a detection logic data, early sampling positions being assigned positive values, late sampling positions being assigned negative values;

calculating m sums for the m frequencies by an accumulator, each of the m sums being calculated using the sampling positions of the n data samples; and determining a target frequency range based on a first frequency associated with a highest sum and a second frequency associated with a lowest sum.

14. The method of claim 13 further comprising determining a target frequency based on an average of the first frequency and the second frequency.

15. The method of claim 14 further comprising performing sampling at the target frequency.

16. The method of claim 13 further comprising adjusting a phase of the n sampling processes on the incoming data.

17. The method of claim 13 wherein each of the m frequencies corresponds to a frequency code.

18. The method of claim 13 further comprising selecting n and m.

19. The method of claim 13 wherein n is at least 500.

20. The method of claim 13 wherein each of the early sampling positions is assigned a value of "1" and each of the late sampling positions is assigned a value of "−1".

* * * * *